(12) United States Patent
Nakatani et al.

(10) Patent No.: US 8,288,778 B2
(45) Date of Patent: Oct. 16, 2012

(54) SEMICONDUCTOR DEVICE HAVING SEMICONDUCTOR ELEMENTS FORMED INSIDE A RESIN FILM SUBSTRATE

(75) Inventors: Seiichi Nakatani, Osaka (JP); Yoshihisa Yamashita, Kyoto (JP); Takashi Kitae, Osaka (JP); Susumu Sawada, Osaka (JP)

(73) Assignee: Panasonic Corporation, Osaka (JP)

( * ) Notice: Subject to any disclaimer, the term of this patent is extended or adjusted under 35 U.S.C. 154(b) by 89 days.

(21) Appl. No.: 12/672,127

(22) PCT Filed: Aug. 6, 2008

(86) PCT No.: PCT/JP2008/002124
§ 371 (c)(1),
(2), (4) Date: Feb. 4, 2010

(87) PCT Pub. No.: WO2009/019865
PCT Pub. Date: Feb. 12, 2009

(65) Prior Publication Data
US 2011/0204366 A1 Aug. 25, 2011

(30) Foreign Application Priority Data
Aug. 7, 2007 (JP) .................... 2007-205203

(51) Int. Cl.
*H01L 51/52* (2006.01)
(52) U.S. Cl. ............ 257/81; 257/40; 257/72; 257/79; 257/E33.001
(58) Field of Classification Search .......... 257/40, 257/72, 79, 81, E33.001
See application file for complete search history.

(56) References Cited

U.S. PATENT DOCUMENTS

| | | | |
|---|---|---|---|
| 2004/0075093 A1* | 4/2004 | Arai et al. ............. | 257/66 |
| 2004/0201107 A1 | 10/2004 | Koenenkamp | |
| 2007/0023837 A1* | 2/2007 | Lee et al. ............. | 257/347 |
| 2007/0131927 A1* | 6/2007 | Kawakami et al. ..... | 257/40 |
| 2007/0134832 A1 | 6/2007 | Oh et al. | |
| 2007/0134857 A1 | 6/2007 | Suh et al. | |
| 2007/0166855 A1 | 7/2007 | Lee et al. | |
| 2008/0049004 A1* | 2/2008 | Kunimori et al. ...... | 345/207 |
| 2009/0179196 A1* | 7/2009 | Adachi et al. ......... | 257/40 |

FOREIGN PATENT DOCUMENTS

CN 1905233 1/2007
(Continued)

OTHER PUBLICATIONS

International Search Report issued Sep. 2, 2008 in International (PCT) Application No. PCT/JP2008/002124.
International Preliminary Report on Patentability issued May 20, 2010 in International (PCT) Application No. PCT/JP2008/002124 (in English).

(Continued)

*Primary Examiner* — Fernando L Toledo
*Assistant Examiner* — Peter Bradford
(74) *Attorney, Agent, or Firm* — Wenderoth, Lind & Ponack, L.L.P.

(57) ABSTRACT

A semiconductor device having a semiconductor elements formed with higher density is provided. Furthermore an image display device using the semiconductor device is also provided.
A semiconductor device comprising a resin film that has a through hole that penetrates from one surface to the other surface thereof, an organic semiconductor disposed inside the through hole, an insulating film on one end of the organic semiconductor, a gate electrode on the insulating film, a source electrode connected electrically to the other end of the organic semiconductor and a drain electrode connected electrically to the other end of the organic semiconductor.

23 Claims, 9 Drawing Sheets

FOREIGN PATENT DOCUMENTS

| | | |
|---|---|---|
| EP | 1 562 240 | 8/2005 |
| JP | 2005-503042 | 1/2005 |
| JP | 2005-302893 | 10/2005 |
| JP | 2006-186294 | 7/2006 |
| JP | 2006-261426 | 9/2006 |
| JP | 2007-67263 | 3/2007 |

OTHER PUBLICATIONS

Chinese Office Action issued Jul. 18, 2011 (with English translation) in a Chinese application that is a foreign counterpart to the present application.

Extended European Search Report issued Jul. 31, 2012 in corresponding European Application No. 08790388.6.

* cited by examiner

SEMICONDUCTOR DEVICE HAVING SEMICONDUCTOR ELEMENTS FORMED INSIDE A RESIN FILM SUBSTRATE

FIELD OF THE INVENTION

The present invention relates to a semiconductor device that has an organic semiconductor, a method for manufacturing the semiconductor device and an image display apparatus equipped with the semiconductor device, and particularly to a semiconductor device that has an organic semiconductor formed on a resin film, a method for manufacturing the semiconductor device and an image display apparatus equipped with the semiconductor device.

DESCRIPTION OF THE RELATED ART

As the number of information terminals in use increases, the need for flat panel displays of lighter weight to be used in computers has grown. The proliferation of information technologies has also increased the opportunities of handling information, which has previously been conveyed by paper media, in the form of electronic information. This trend has increased the needs for electronic paper or digital paper for mobile display medium that is thin and light weight and can be easily carried (JP 2007-67263A, etc.).

In a flat panel display apparatus in general, a display medium is formed by using elements based on liquid crystal, organic EL (electro-luminescence), electrophoresis or the like. Such a display medium chiefly employs active drive elements (TFT elements) as the picture drive elements, in order to ensure the uniformity of screen brightness, screen refreshing rate and other performance. In an ordinary computer display, for example, the TFT elements are formed on a glass substrate, and liquid crystal or organic EL elements are sealed therein.

As the TFT element, a Si semiconductor such as a-Si (amorphous silicon), p-Si (polycrystalline silicon) or the like is mainly used. The Si semiconductor (together with a metal layer as required) is formed in a plurality of layers so as to form source, drain and gate electrodes successively on the substrate, thereby constituting the TFT element.

Formation of the TFT element from the Si semiconductor involves the following two problems.

First, it is necessary to form the layers by repeating the sputtering and other manufacturing steps in a vacuum system that requires a vacuum chamber, thus making the equipment cost and the running cost very expensive. For example, forming each layer requires it to repetitively carry out vacuum vapor deposition, doping, photolithography, development of a latent image and other steps, and the element is formed on the substrate through several dozens of steps. The semiconductor that is the critical part of switching operation is also formed by stacking semiconductor layers of a plurality of kinds such as p type and n type. With such a conventional manufacturing method that uses the Si semiconductor, it is difficult to change the production facilities so as to manufacture larger display screens, because this requires a significant design change of the production facilities such as the vacuum chamber.

Second, materials to be used for the substrate are limited to heat resistant ones, and materials such as resin film that are light in weight and have flexibility cannot be used as the substrate.

The process of forming the TFT element from Si includes heating to a temperature as high as 500 to 1000° C. Therefore, the substrate must be formed from a material that endures such a high temperature, which is practically limited to glass. As a result, when a thin display such as electronic paper or digital paper is made by using TFT elements based on Si semiconductor, use of the glass substrate makes the display heavy and hard without flexibility, and thus it is easily broken when dropped. Namely, it is difficult to meet the needs for portable and slim display with a display apparatus constituted by forming TFT elements on a glass substrate.

A semiconductor material that has been vigorously researched in recent years as a promising candidate for solving the problems described above is the organic semiconductor material. The organic semiconductor is an organic compound that has high charge transport properties, and is applicable to an organic laser oscillating element and an organic thin film transistor (organic TFT) as well as the charge transporting material of an organic EL element.

A semiconductor device (organic semiconductor device) based on an organic semiconductor can be made in a process of a relatively low temperature, and therefore allows for a more tolerant requirement of heat resistance on the substrate, so that the TFT elements can be formed on a flexible substrate such as transparent resin substrate. An organic semiconductor having the form of solution can also be made by properly modifying the molecular structure. When the organic semiconductor solution is used as an ink in a printing process based on ink jet method, it is made possible to manufacture the semiconductor device under the condition that does not require a vacuum such as in inactive gas atmosphere.

Electronics technology based on a printing process makes it possible to carry out the process at a lower temperature (not using high temperature), mitigate the vacuum process (in addition to the advantage of not using vacuum) and carry out the process without photolithography (not using photolithography).

FIG. 14 is a sectional view schematically showing the structure of a semiconductor device (flexible semiconductor device) 1000 that includes an organic semiconductor 130 manufactured by using the printing process. The semiconductor device 1000 has such a structure as layers (120, 130, 140, 150) are formed by printing on a resin substrate (such as PET or PI) 110. In the structure illustrated, a wiring layer 120, an organic semiconductor layer 130, an insulating film 140 and a wiring layer 150 are formed successively on the resin substrate 110. While the specific structure may be altered as required, a source electrode 120s, a drain electrode 120d and a gate electrode 150g are disposed around the organic semiconductor layer 130, thereby forming the organic TFT.

The display that is lighter in weight than the conventional displays and has flexibility so as not to break (or very unlikely to break) when dropped can be made as described above, by forming the TFT elements that drive the display material on the transparent resin substrate.

There are demands for thin displays such as electronic paper or digital paper that are further more compact and lighter in weight. To meet the demands, it is necessary to form the semiconductor elements with higher density in the semiconductor device 1000.

Similarly, there are also strong demands for stationary image display apparatuses based on liquid crystal or organic EL that are larger in screen size but are smaller in weight and depth, and for higher definition (higher resolution) to be achieved by forming more pixels in a given area. It is necessary to form the semiconductor elements with higher density in the semiconductor device 1000 also for the purpose of meeting these demands.

However, since the semiconductor device 1000 has such a structure as flat layers (120, 130, 140, 150) are formed one after another on the resin substrate 110, there is a limitation on the improvement of density of semiconductor elements that can be formed.

SUMMARY OF THE INVENTION

An object of the present invention is to provide a semiconductor device having semiconductor elements packed with a higher density by forming the semiconductor elements inside of a resin film substrate, and a method for manufacturing the same. Another object of the present invention is to provide an image forming apparatus that employs the semiconductor device having the semiconductor elements formed inside the resin film substrate.

A first aspect of the present invention is a semiconductor device comprising a resin film that has a through hole that penetrates from one surface to the other surface thereof, an organic semiconductor disposed inside the through hole, an insulating film on one end of the organic semiconductor, a gate electrode on the insulating film, a source electrode connected electrically to the other end of the organic semiconductor and a drain electrode connected electrically to the other end of the organic semiconductor.

A second aspect of the present invention is the semiconductor device according to the first aspect, further comprising a second resin film that is bonded to the other surface of the resin film.

A third aspect of the present invention is the semiconductor device according to the second aspect, wherein the second resin film has a second through hole and a via conductor formed from an electrically conductive composite material in the second through hole.

A fourth aspect of the present invention is the semiconductor device according to the second or third aspect, wherein the organic semiconductor is sealed by the source electrode, the drain electrode, the insulating film and the second resin film.

A fifth aspect of the present invention is the semiconductor device according to any one of the first to fourth aspect, wherein the source electrode and the drain electrode have comb shape and are disposed to oppose each other at a distance so as to mesh with each other.

A sixth aspect of the present invention is the semiconductor device according to any one of the first to fifth aspects, wherein the insulating layer is located in the through hole.

A seventh aspect of the present invention is the semiconductor device according to any one of the first to sixth aspects, wherein the organic semiconductor is formed along the wall surface of the through hole and has a hollow space.

An eighth aspect of the present invention is the semiconductor device according to the seventh aspect, wherein the hollow space of the organic semiconductor is filled with the gate electrode.

A ninth aspect of the present invention is the semiconductor device according to the eighth aspect, wherein the insulating film extends over one surface of the resin film.

A tenth aspect of the present invention is the semiconductor device according to any one of the first to ninth aspects, wherein the organic semiconductor is a high molecular organic semiconductor.

An eleventh aspect of the present invention is the semiconductor device according to any one of the first to ninth aspects, wherein the organic semiconductor is a low molecular organic semiconductor.

A twelfth aspect of the present invention is the semiconductor device according to any one of the first to eleventh aspects, wherein the resin film is formed from any one material selected from the group consisting of a polyimide resin, a polyamide resin, a polyethylene naphthalate resin and an aramid resin.

A thirteenth aspect of the present invention is the semiconductor device according to any one of the first to twelfth aspects, wherein the source electrode and the drain electrode are formed from a noble metal.

A fourteenth aspect of the present invention is an image display apparatus comprising a display section that has an array of light emitting elements and a drive circuit layer that drives the light emitting elements used in the display section, wherein the drive circuit layer includes the semiconductor device according to any one of the first to thirteenth aspects.

A fifteenth aspect of the present invention is the image display apparatus according to the fourteenth aspect, wherein the semiconductor element of the semiconductor device according to any one of the first to thirteenth aspects is used as a ON/OFF switching transistor.

A sixteenth aspect of the present invention is the image display apparatus according to the fourteenth or fifteenth aspect, wherein the semiconductor element of the semiconductor device according to any one of the first to thirteenth aspects is used as a driver transistor that drives the light emitting element to emit light.

A seventeenth aspect of the present invention is the image display apparatus according to any one of the fourteenth to sixteenth aspects, wherein the light emitting element is an organic electroluminescence element.

An eighteenth aspect of the present invention is a method for manufacturing a semiconductor device, which comprises: (1) a step of forming a source electrode and a drain electrode on one surface of a resin film and forming a through hole that has the source electrode and the drain electrode located on the bottom surface from the other surface of the resin film to the one surface, (2) a step of forming an organic semiconductor in the through hole so as to bring one end thereof into contact with the source electrode and the drain electrode, (3) a step of forming an insulating layer on the other surface of the organic semiconductor, a part of the insulating layer serving as a gate insulating film, and (4) a step of forming a gate electrode that on the section that serves as the gate insulating film of the insulating layer.

A nineteenth aspect of the present invention is the method for manufacturing a semiconductor device according to the eighteenth aspect, wherein the step (1) includes a step of disposing the one surface of the resin film on the surface of a second resin film that has a source electrode and a drain electrode disposed thereon.

A twentieth aspect of the present invention is the method for manufacturing a semiconductor device according to the nineteenth aspect, wherein the second film includes a wiring layer disposed on the other surface thereof, and a via conductor for allowing the wiring layer to conduct with the source electrode or the drain electrode.

A twenty-first aspect of the present invention is the method for manufacturing a semiconductor device according to any one of the eighteenth to twentieth aspects, wherein the organic semiconductor has a hollow space and is formed on the wall surface of the through hole.

A twenty-second aspect of the present invention is the method for manufacturing a semiconductor device according to the twenty-first aspect, wherein the gate electrode is formed so as to fill the hollow space.

A twenty-third aspect of the present invention is the method for manufacturing a semiconductor device according to the twenty-second aspect, wherein the insulating layer extends over the other surface of the resin film.

It is made possible to provide a semiconductor device of high-density integration and a method for manufacturing the same, by using the semiconductor device in which an organic semiconductor is disposed inside a through hole provided in a resin film, one end of the organic semiconductor is covered with a gate insulating film, a gate electrode is disposed on the gate insulating film, and a source electrode and a drain electrode are provided to the other end of the organic semiconductor. Use of the semiconductor device also makes it possible to provide an image display apparatus that is smaller in size such as depth and lighter in weight.

DETAILED DESCRIPTION OF THE INVENTION

Figure 1:
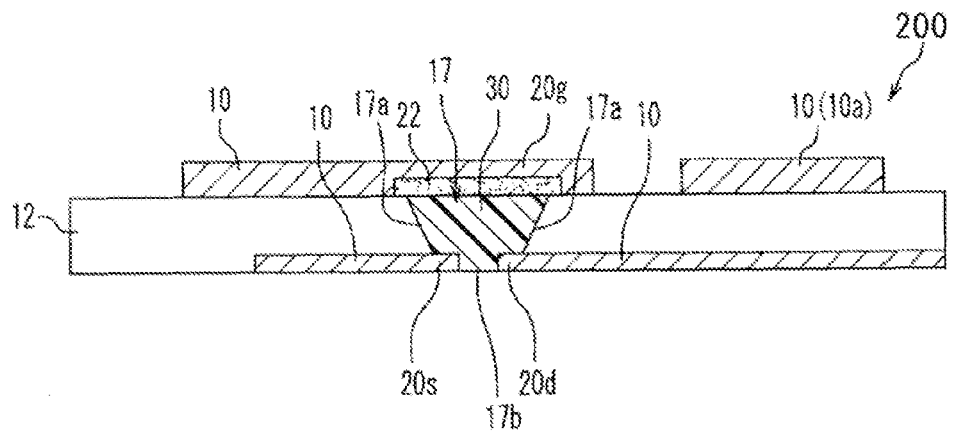
FIG. 1 is a sectional view schematically showing the constitution of a semiconductor device 200 according to a first embodiment of the present invention.

Embodiments of the present invention will be described in detail below with reference to the accompanying drawings. In the description that follows, terms that indicate particular direction or position (such as upper, lower, right, left and other phrases including thereof) will be used as required, which is for the purpose of making it easier to understand the present invention with reference to the attached drawings. These terms are not intended to restrict the scope of the present invention. Identical reference numeral used in different drawings means the identical part or member.

First Embodiment

FIG. 1 is a partial sectional view schematically showing the constitution of a semiconductor device 200 according to the first embodiment of the present invention. The semiconductor device 200 has an organic semiconductor section 30 provided in a through hole 17. Namely, the semiconductor device 200 has a resin film (flexible substrate) 12 that has the through hole 17 formed therein, while an organic semiconductor section 30 is disposed inside the through hole 17 so as to make contact with the wall surface (inner wall) 17a. An insulating layer 22 is disposed so as to cover one end (upper end in FIG. 1) of a semiconductor device section 30, while the insulating layer 22 serves as a gate insulating film. On the gate insulating film 22, an electrically conductive layer 10 extending over one surface (upper surface in FIG. 1) of the resin film 12. The section on the gate insulating film 22 of the electrically conductive layer 10 serves as a gate electrode 20g.

On the other surface (lower surface in FIG. 1) of the resin film 12, an electrically conductive layer 10 is disposed, while one portion of the electrically conductive layer makes ohmic contact with the other end (lower end in FIG. 1) of the organic semiconductor section 30 as a source electrode 20s. On the other surface of the resin film 12, another electrically conductive layer 10 is disposed and one portion thereof makes ohmic contact with the other end of the organic semiconductor section 30 as a drain electrode 20d. The source electrode 20s and the drain electrode 20d are disposed at a predetermined distance from each other.

The source electrode 20s and the drain electrode 20d each constitutes portions of the bottom surface 17b of the through hole 17. In the embodiment shown in FIG. 1, the organic semiconductor section 30 fills into the space between the source electrode 20s and the drain electrode 20d, and also the organic semiconductor section 30 between the source electrode 20s and the drain electrode 20d constitutes the bottom surface 17b.

Thus, a semiconductor element (FET) comprising an organic semiconductor section 30, a source electrode 20s, a drain electrode 20d, an insulating layer (gate insulating film) 22 and a gate electrode 20g is formed in a semiconductor device 200.

Even if the organic semiconductor section 30 does not exist between the source electrode 20s and the drain electrode 20d facing each other (between the surface at the right side of the source electrode 20s and the surface at the left side of the drain electrode 20d in FIG. 1), there is no particular problem if it is possible to ensure flow of electric current between the source electrode 20s and the drain electrode 20d via the organic semiconductor section 30 located at the upper part of the source electrode 20s and the drain electrode 20d.

In this embodiment, the organic semiconductor section 30 is disposed in the through hole 17 of the substrate (resin film) 12 in which an organic semiconductor element has never been formed in the conventional art, while the gate electrode 20g and the gate insulating layer 22 are disposed on one surface of the resin film 12, and the source electrode 20s and the drain electrode 20d are disposed on the other surface of the resin film 12. As a result, since space for the semiconductor device 200 can be efficiently utilized three-dimensionally, the semiconductor elements can be formed with a higher density.

Figure 2:
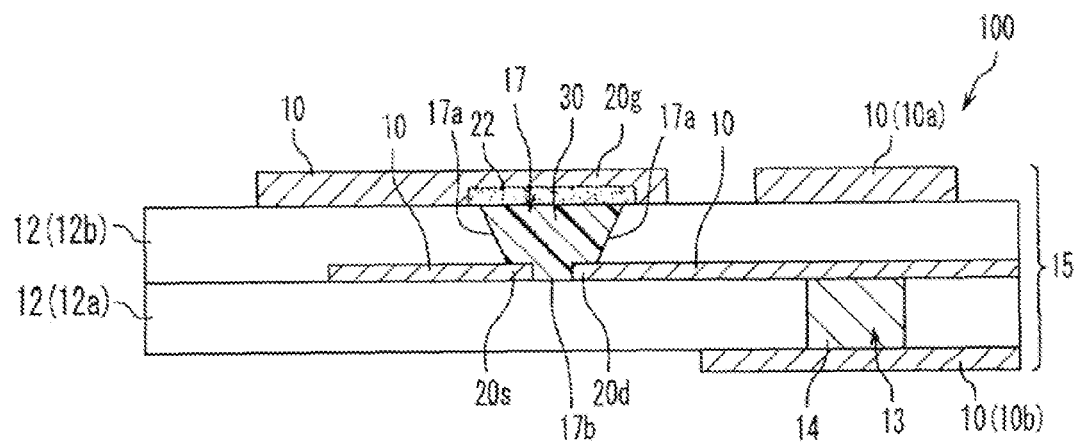
FIG. 2 is a sectional view schematically showing the constitution of a semiconductor device 100 according to the first embodiment of the present invention.

FIG. 2 is a sectional view schematically showing another semiconductor device 100 within the scope of this embodiment. The semiconductor device 100, similarly to the semiconductor device 200, has the resin film 12b (12) that has the through hole 17 and the organic semiconductor section 30 is disposed inside the through hole 17. Similar to the semiconductor device 100, a semiconductor element (FET) is constituted from the organic semiconductor section 30, the source electrode 20s, the drain electrode 20d, the insulating layer (gate insulating layer) 22 and the gate electrode 20g. The resin film 12b has, formed on both surfaces thereof, the electrically conductive layer 10 that includes any one of the source electrode 20s, the drain electrode 20d and the gate electrode 20g.

The semiconductor device 100, unlike the semiconductor device 200, further has a second resin film 12a (12). The resin film 12a is disposed by bonding with the surface of the resin film 12b whereon the source electrode 20s and the drain electrode 20d are provided (lower surface of the resin film 12b in FIG. 2), and the electrically conductive layer 10 including the source electrode 20s and the electrically conductive layer 10 including the drain electrode 20s are sandwiched by the resin film 12a and the resin film 12b.

The resin film 12a has the through hole (via hole) 13 that has an interlayer connection member (via conductor) 14 disposed therein. The resin film 12a also has, on the other surface thereof (the surface that does not contact the gate electrode 20g and drain electrode 20d), the electrically conductive layer 10 (10b) that is electrically connected with the drain electrode 20d through the via conductor 14.

The semiconductor device 100 has three electrically conductive layers 10 (10b) (the electrically conductive layer 10 on one surface of the resin film 12b, the electrically conductive layer 10 disposed between the resin film 12a and the resin film 12b, and the electrically conductive layer 10 on the other surface of the resin film 12a) and the multilayer substrate 15 that comprises two resin films, namely the resin film 12a and the resin film 12b.

Furthermore, in the embodiment shown in FIG. 2, the semiconductor device 100 has, on one surface of the resin film, an electrically conductive layer 10 (10a) that is not connected to the gate electrode 20g. As described above, the semiconductor device 100 may have, on resin film 12 (12a or 12b), a wiring layer (electrically conductive layer) 10a that is not connected to any of the source electrode 20s, the drain electrode 20d and the gate electrode 20g.

The semiconductor device 100 constituted as described above has such an advantage as, in addition to the benefit that the space can be efficiently utilized three-dimensionally, wiring can also be done three-dimensionally by means of the multilayer substrate 15 so that complicated wiring can be provided within a smaller space.

This embodiment also includes the semiconductor device in which the via conductor 14 and the electrically conductive layer 10b are not electrically connected with the drain electrode 20d, but are electrically connected with the source electrode 20s. Furthermore, this embodiment includes the semiconductor device in which the resin film 12a is disposed on the upper surface of the resin film 12b and the electrically conductive layer 10 including the gate electrode 20g is sandwiched between the resin film 12a and the resin film 12b.

A source electrode 20Ms and a drain electrode 20Md as variations of the source electrode 20s and the drain electrode 20d in the semiconductor devices 100, 200 will be shown below.

Figure 3:
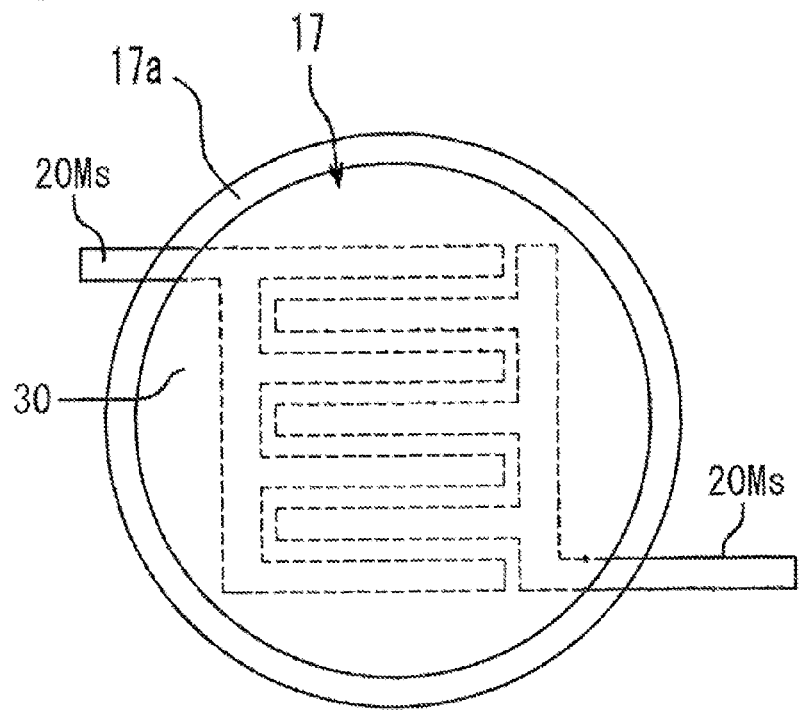
FIG. 3 is a top view showing the variation of placement of a source electrode and a drain electrode.

FIG. 3 is a top view showing the inside of the through hole 17 when viewed from the direction perpendicular to the upper surface of the resin film 12 (12b). For easier understanding of the shapes of the source electrode 20Ms and the drain electrode 20Md, the description of the gate electrode 20g and the insulating film 22 was omitted.

The source electrode 20Ms and the drain electrode 20Md have a comb shape and are disposed oppositely so that the comb sections are meshed (or engaged) with each other.

Namely, this variation is characterized in that the comb-shaped source electrode 20Ms and drain electrode 20Md are formed in one through hole 17.

In the semiconductor device 100 or 200, the channel length (distance between the source electrode 20Ms and the drain electrode 20Md) is 10 μm and the channel width (length of the portion where the source electrode 20Ms and the drain electrode 20Md oppose each other, or length between comb-shaped electrodes) is 1,000 μm. That is, the channel width is 100 times the channel length in this case. The width of the comb section of the source electrode 20Ms or the drain electrode 20Md is 25 μm, and line/space (L/S) is 25 μm/10 μm.

Forming the source electrode and the drain electrode in the comb shape makes it possible to greatly increase the channel width, thereby flowing an electric current (large electric current) large enough to drive the organic EL element between the source electrode 20Ms and the drain electrode 20Md.

Materials and other aspects of the constitution of the source electrode 20Ms and the drain electrode 20Md other than the shape are same as those of the source electrode 20s and the drain electrode 20d.

The source electrode 20Ms and the drain electrode 20Md that have the comb shape are not limited to the semiconductor devices 100 and 200 and can be applied to any of the semiconductor devices to be hereinafter described.

The operating principle of the semiconductor devices 100 and 200 will be described below.

When a voltage is applied to the gate electrode 20g of the semiconductor device 100, 200, carriers of the electric charge that is repelled by the polarity of the applied voltage within the organic semiconductor section 30 are repelled from the vicinity of the gate electrode (a depleted layer is created). Furthermore, when a voltage higher than a certain level is applied, carriers of the electric charge that is attracted by the polarity of the voltage applied to the gate electrode 20g are induced into the interface between the insulating layer (gate insulating film) 22 and the organic semiconductor section 30, and are accumulated therein. When a voltage is applied between the source electrode 20s and the drain electrode 20d under this condition, the carriers accumulated in the interface are driven by the electric field generated between the source electrode and the drain electrode so as to be absorbed by the drain, thereby generating a current flowing between the source electrode and the drain electrode.

When the amount of the carriers accumulated in the interface is modulated by controlling the voltage that is applied to the gate electrode 20g, the current flowing between the drain electrode 20d and the source electrode 20s can be varied so as to enable, for example, switching operation.

The components of the semiconductor devices 100 and 200 will be described in detail below.

The resin film 12 (12a, 12b) is formed, for example, from a polyimide resin (PI), a polyamide resin (PA), a polyethylene naphthalate resin (PEN) or an aramid resin. These resin materials have excellent properties of heat resistance, dimensional stability and preventing gas permeation, and are preferably used as the material to form the flexible substrate (resin film) 12 of the semiconductor device 100, 200. The resin film 12 has thickness in a range, for example, from 1 to 38 μm.

The through hole 17 formed in the resin film 12 has truncated conical shape (round cross section parallel to the surface of the resin film 12 and trapezoidal sectional cross section perpendicular to the surface of the resin film) formed by, for example, laser machining. In the embodiment shown in FIG. 1 and FIG. 2, cross sectional area of the through hole 17 is greater on the side of the upper surface of the resin film 12 (12b) than on the side of the lower surface of the resin film 12 (12b), thus forming a shape flaring upward.

The diameter of the through hole 17 is, for example, from 1 to 300 μm on the side of the upper surface (diameter of opening on the upper surface) of the resin film 12 (12b) where the cross sectional area is larger.

In case one semiconductor device comprises a plurality of semiconductor elements, it is not necessary to equalize the cross sectional areas of the through holes 17 of the semiconductor elements which may be different from each other. In case the semiconductor device 100 comprises two semiconductor elements, for example a switching transistor and a drive transistor, transistors having different characteristics, such as transistors having different channel lengths, can be easily formed by forming the semiconductor elements with the through holes 17 that have different cross sectional areas (areas of openings).

The through hole 17 is not limited to the truncated conical shape described above, and may be formed in various shapes such as cylinder.

While the through hole (via hole) 13 of the semiconductor device 100 has cylindrical shape in the embodiment shown in FIG. 2, it is not limited to this shape, and may be formed in various shapes such as truncated cone. The interlayer connection member 14 that fills the through hole 13 is formed from an electrically conductive material such as electrically conductive resin paste.

The source electrode 20s and the drain electrode 20d are formed from a metal layer. The metal layer is formed by, for example, copper plating with a thickness in a range from 0.1 to 18 μm. The source electrode 20s and the drain electrode 20d may also be formed from a noble metal (such as Au), with a thickness in a range from 0.02 to 3 μm. The source electrode 20s and the drain electrode 20d formed from a metal other than a noble metal such as copper may also be plated with a noble metal (such as Au) on the surface thereof that makes contact with the organic semiconductor section 30.

The source electrode 20s and the drain electrode 20d may also be formed, beside the material described above, from a material selected from the group consisting of chromium (Cr), titanium (Ti), aluminum (Al), molybdenum (Mo), tungsten (W), nickel (Ni), palladium (Pd), platinum (Pt), silver (Ag), tin (Sn), electricity conducting polyaniline, electricity conducting polypyrrole, electricity conducting polythiazyl and electricity conducting polymer, and combinations thereof. The source electrode 20s and the drain electrode 20d may also be constituted from a bilayer electrode of an Au layer and a Cr layer, or a bilayer electrode of an Au layer and a Pt layer.

The electrically conductive layer 10 including the gate electrode 20g may be formed from a material selected from the group consisting of chromium (Cr), titanium (Ti), copper (Cu), aluminum (Al), molybdenum (Mo), tungsten (W) nickel (Ni), gold (Au), palladium (Pd), platinum (Pt), silver (Ag), tin (Sn), electricity conducting polyaniline, electricity conducting polypyrrole, electricity conducting polythiazyl and electricity conducting polymer, and combinations thereof.

The insulating layer (gate insulating film) 22 is formed from PVA (polyvinyl alcohol), PVP (poly-4-vinylphenol), BCB (benzocyclobutene) or $SiO_2$ formed by applying polysilazane. The insulating layer (gate insulating film) 22 may also be formed from an epoxy resin. The thickness of the gate insulating layer (gate insulating film) 22 is, for example, from 50 to 300 nm.

The organic semiconductor section 30 fills the inside of the through hole 17, and is disposed so as to make ohmic contact with the source electrode 20s and the drain electrode 20d, and contact with the gate insulating film 22.

Various materials may be used for the organic semiconductor material that constitutes the organic semiconductor section 30. An organic semiconductor material that has high mobility is preferably used, such as pentacene. Organic semiconductor materials are roughly classified into high molecular materials (such as polythiophene or a derivative thereof), low molecular materials (such as pentacene or solubilized pentacene), nano-carbon materials (such as carbon nanotube, SiGe nanowire, fullerene, modified fullerene), inorganic-organic composite materials (such as a composite material constituted from $C_6H_5C_2H_4NH_3$ and $SnI_4$), all of which can be used as the organic semiconductor section 30. Other examples of the organic semiconductor material will be further described later.

In the semiconductor device 100, the organic semiconductor section 30 is preferably sealed by the insulating layer 22, the source electrode 20s, the drain electrode 20d and the resin film 12a by bringing the insulating layer 22 into contact with one surface (upper surface in FIG. 3) of the resin film 12b and also bringing the resin film 12a into contact with the source electrode 20s and the drain electrode 20d.

The following problem of the semiconductor device 1000 of the conventional art can be solved by this preferred aspect. Namely, the organic semiconductor has lower mobility than those of inorganic semiconductor materials (such as polysilicon) and, moreover, the mobility may further decrease in the atmosphere or air or oxygen. Therefore, there is such a problem that deterioration of the organic semiconductor layer 140 may be caused by oxygen after formation of the organic semiconductor layer 140 by a printing process.

In the semiconductor device 100, the organic semiconductor section 30 can be restricted from making contact with oxygen (or air) by sealing the organic semiconductor section 30, so that chronic degradation of the organic semiconductor that constitutes the organic semiconductor section 30 can be suppressed or mitigated.

It is one of remarkably significant features of the semiconductor device 100 according to the present invention in which the organic semiconductor section 30 is disposed in the through hole 17 that contact between the organic semiconductor section 30 and oxygen can be suppressed.

In the semiconductor devices 100 and 200, as described above, the gate electrode 20g, the source electrode 20s and the drain electrode 20d can all be formed from metal foil such as plating.

This means that it is made possible to solve the problems described below that arise when the wiring layers 120, 150 that include the gate electrode, the source electrode and the drain electrode are formed by a printing process such as ink jet printing in the semiconductor device 1000 of the conventional art.

The semiconductor device 1000 of the conventional art has such problems that a sintering temperature as high as 600 to 1,000° C. that inhibits the use of resin film substrate is required, for forming the wiring layers from ordinary metal particles, and that ink jet nozzles may be clogged. Accordingly, the wiring is formed from a mixture of an ink solution and metal particles that have been made extremely small on the order of nanometers (nano-paste material).

However, the nano-paste material is very expensive. In addition, the wiring that is formed from the nano-paste material is formed by sintering metal particles on the order of nanometers, and therefore has a problem of high electrical resistance due to oxide film on the surface of the metal particles.

The semiconductor devices 100 and 200 of this embodiment do not require the use of nano-paste material, and therefore make it possible to form a wiring that includes the gate electrode, the source electrode and the drain electrode at a lower cost than in the case of the semiconductor device 1000 of the conventional art, and significantly decrease the electrical resistance.

Variations of the semiconductor device 100 will be described below.

Figure 4:
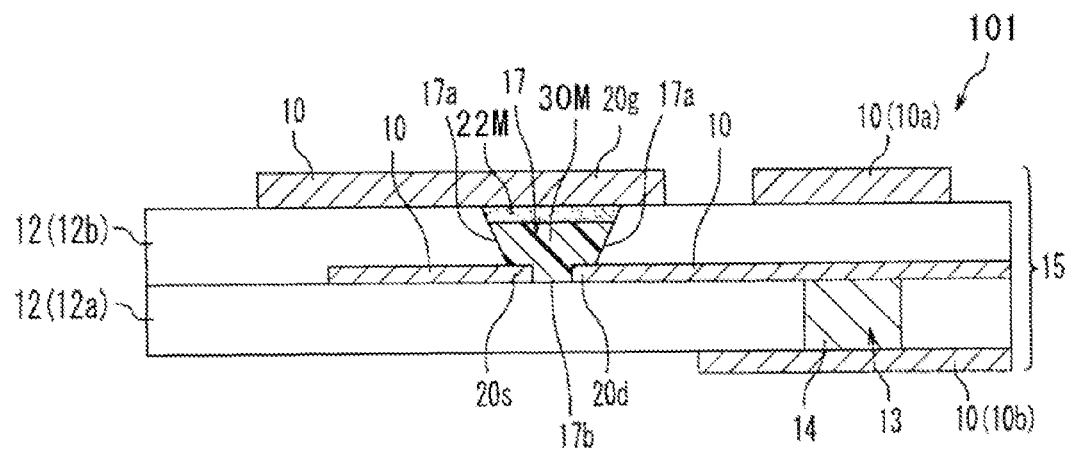
FIG. 4 is a sectional view schematically showing the constitution of a semiconductor device 101 according to the first embodiment of the present invention.
Figure 5:
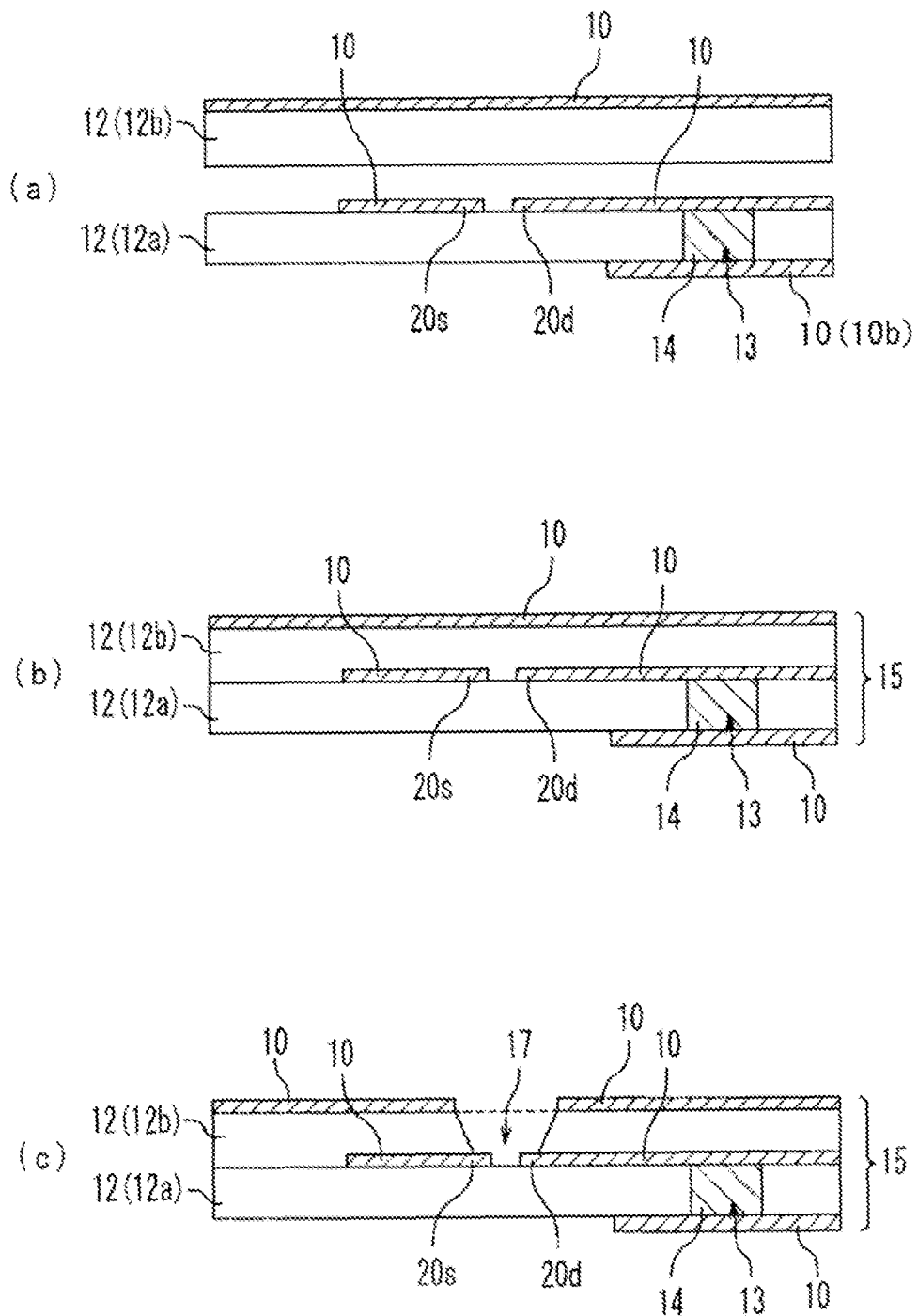
FIG. 5 is a sectional view showing a method for manufacturing a semiconductor device 100 according to the first embodiment of the present invention.
Figure 6:
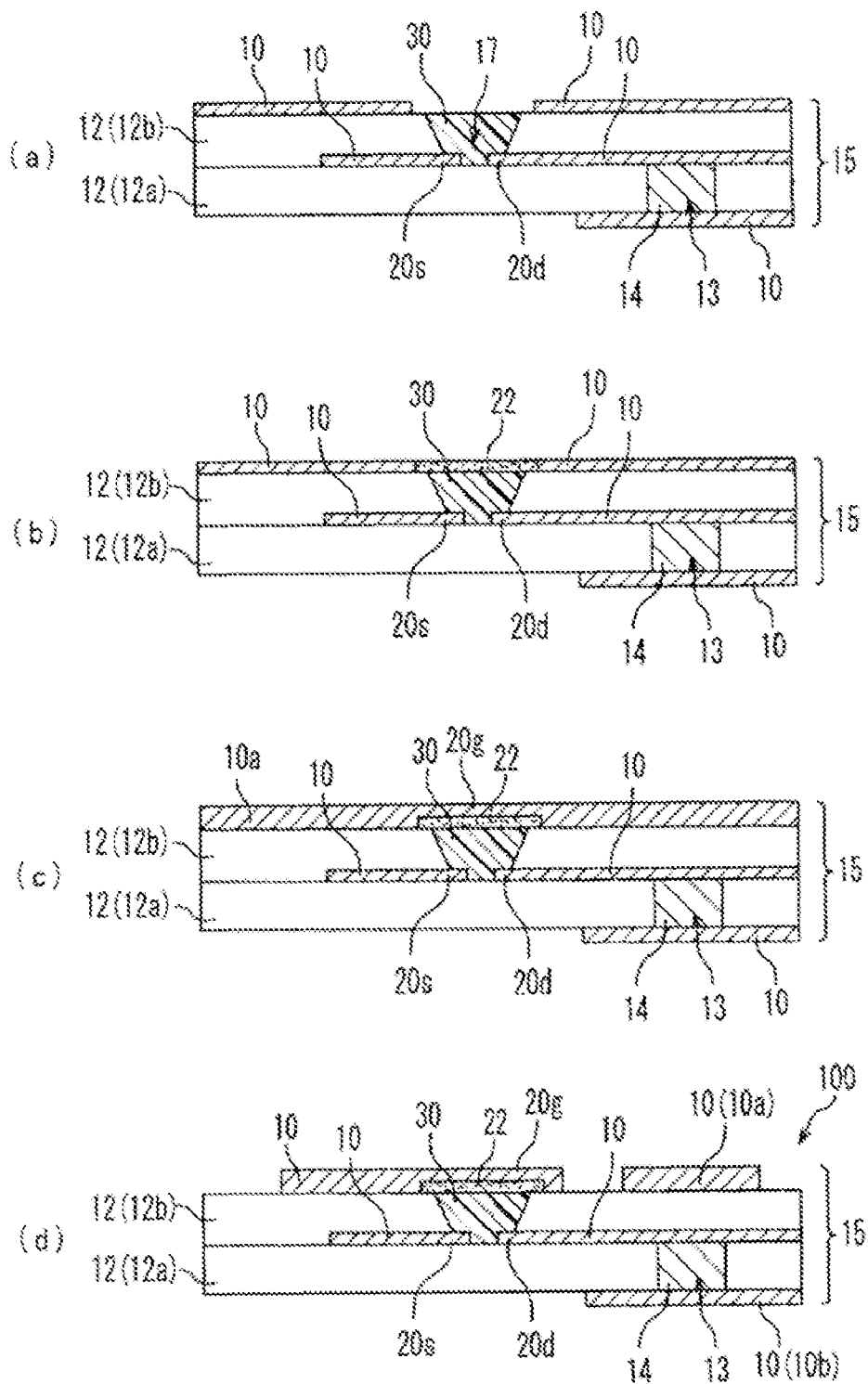
FIG. 6 is a sectional view showing a method for manufacturing a semiconductor device 100 according to the first embodiment of the present invention.

FIG. 4 is a sectional view showing a semiconductor device 101 according to the first embodiment.

In the semiconductor device 100 shown in FIG. 2, the upper end surface of the organic semiconductor section 30 has the same height (level) as that of the top surface of the resin film 12b and the insulating layer 22 is located above the through hole 17. In the semiconductor device 101 shown in FIG. 4, the top surface of the organic semiconductor section 30M is located below that of the resin film 12b. The insulating layer 22M disposed in contact with the upper end surface of the organic semiconductor section 30M is disposed inside the through hole 17.

As described above, by disposing the insulating layer 22M inside the through hole 17, it is possible to bring the insulating layer 22M close to the gate electrode 20s and the drain electrode 20d without changing the thickness of the resin film 12b. Therefore, it becomes possible for the semiconductor element (FET) of the semiconductor device 101 to flow large electric current with a small size.

Regarding FET, as a result of evocation of carrier to the vicinity of the gate insulating film 22M of the organic semiconductor section 30M by the voltage applied to the gate electrode 20g, an electric current flows between the source electrode 20s and the drain electrode 20d.

However, since channel evocation by the gate insulating film 22M does not arise in the vicinity of the wall surface 17a of the organic semiconductor section 30M, high electric resistance is maintained even when a voltage is applied to the gate electrode 20g.

In the semiconductor device 101 in which a distance between the gate insulating film 22M, and the source electrode 20s and drain electrode 20d is short, the above-described portion with high electric resistance located in the vicinity of the wall surface 17a of the organic semiconductor section 30M can be reduced. As a result, an ON/OFF ratio of drain electric current with or without application of a voltage (gate voltage) to the gate electrode 20g is increased, and thus it becomes possible to flow (take-off) a large electric current with a small size.

In the semiconductor device 101, since a distance between the gate insulating film 22M, and the source electrode 20s and the drain electrode 20d is short, it is also possible to decrease the thickness of the entire device.

In preferred embodiment, the upper surface of the insulating layer 22 and that of the resin film 12b have the same height (level) since it is possible to adjust the thickness of the electrically conductive layer 10 including the gate electrode 20g to the same thickness as that of the gate electrode 20g at the other part.

The method for manufacturing a semiconductor device 100 of the first embodiment will be described below with reference to FIG. 5(a) to FIG. 6(d).

Step 1

The resin film 12 (12a) having the electrically conductive layer 10 including the source electrode 20s formed and the electrically conductive layer 10 including the drain electrode 20d formed on one surface, as well as the electrically conductive layer 10 (10b) formed on the other surface is prepared as shown in FIG. 5(a).

The resin film 12 may be, for example, an aramid resin film having a thickness of 4 μm. Other resins may also be used such as a polyimide resin, a polyamide resin and a polyethylene naphthalate resin.

The resin film 12a may have an adhesive layer on the surface since it is easy to bond (stack) with the resin film 12b in the step 2 shown below.

The electrically conductive layers 10 may be formed from a copper foil (having a thickness of, for example, 5 μm). The electrically conductive layers 10 may also be patterned. The resin film 12a has the interlayer connection member (via conductor) 14 that connects the electrically conductive layer 10 provided on the upper surface thereof and the electrically conductive layer 10 provided on the lower surface thereof. The interlayer connection member 14 is formed from, for example, an electrically conductive paste that fills in the through hole (via hole) 13.

Step 2

The lower surface of the resin film 12b having the electrically conductive layer (metal layer) 10 provided on the upper surface thereof is brought into contact with the upper surface of the resin film 12a, thereby bonding (stacking) the resin film 12a with the resin film 12b to form a multilayer resin substrate 15 as shown in FIG. 5(b).

Step 3

The through hole 17 extending from the upper surface of the resin film 12b of the multilayer resin substrate 15 to the source electrode 20s and the drain electrode 20d is formed as shown in FIG. 5(c). Therefore, at least one part of the source electrode 20s and the drain electrode 20d is exposed. In the embodiment shown in FIG. 5(c), the through hole 17 is formed by irradiating with laser beam, although the through hole 17 may be formed by other method such as etching. Also in this embodiment, the through hole 17 has round shape when viewed from above the resin film 12, but may also have other shape such as oval, elongated circle or rectangle.

Step 4

The through hole 17 is filled with a material that includes the organic semiconductor as shown in FIG. 6(a), so as to form the organic semiconductor section 30 in the through hole 17.

As the organic semiconductor material that constitutes the organic semiconductor section 30 of this embodiment, while partially overlapping with that described above, the following materials may be used: (1) an acene molecular material selected from the group consisting of naphthalene, anthracene, tetracene, pentacene, hexacene and derivatives thereof; (2) a pigment selected from the group consisting of a phthalocyanine compound, an azo compound and a perylene compound, and derivative thereof; (3) a low molecular compound selected from the group consisting of a hydrazone compound, a triphenylmethane compound, a diphenylmethane compound, a stilbene compound, an arylvinyl compound, a pyrazoline compound, a triphenylamine compound and a triarylamine compound, and derivative thereof; and (4) a high molecular compound selected from the group consisting of poly-N-vinylcarbazole, halogenated poly-N-vinylcarbazole, polyvinylpyrene, polyvinyl anthracene, a pyrene-formaldehyde resin and an ethylcarbazole formaldehyde resin. Alternatively, the organic semiconductor material may also be a fluorenone-based compound, a diphenoquinone-based compound, a benzoquinone-based compound, an indenone-based compound, a porphyrin-based compound, a polythiophene-based compound or a polyphenylene-based compound.

The organic semiconductor section 30 can be formed by printing. In this embodiment, since the organic semiconductor section 30 can be formed by filling the through hole 17 with a material that includes the organic semiconductor, position of the organic semiconductor section 30 is determined when the position is determined for forming the through hole 17, providing a great technical advantage.

When the organic semiconductor section of the conventional art is formed by ink jet printing, it is necessary to maintain positioning accuracy of an ink jet ejecting tool and hold the ink that includes the organic semiconductor precisely at the predetermined positions by forming a bank or other member. According to this embodiment, however, once the through hole 17 is precisely positioned, the organic semiconductor section 30 can be formed according to the position.

In case the organic semiconductor material is a high molecular organic semiconductor (such as polythiophene or a derivative thereof), it is preferable to form the organic semiconductor section 30 by the printing process.

In case the organic semiconductor material is a low molecular organic semiconductor (such as pentacene), it is preferable to form the organic semiconductor section 30 by the vapor deposition process.

Step 5

On the upper end of the organic semiconductor section 30, a gate insulating film (insulating layer) 22 is formed as shown in FIG. 6(b). The gate insulating film 22 can be formed, for example, by applying an insulating material. As the method for forming the gate insulating film 22, for example, an electrodeposition coating method of forming an electrodeposition coating film, a spraying method using a spray coater, or an ink-jet method can be employed.

Step 6

On the gate insulating film 22, a metal layer (electrically conductive layer) 10a including the gate electrode 20g is formed as shown in FIG. 6(c). In this embodiment, metal plating (for example, copper plating) is performed so as to cover the gate insulating film 22 to form a metal layer 10a.

Step 7

As shown in FIG. 6(d), the metal layer 10a is patterned to form a wiring layer 10 including the gate electrode 20g and another wiring layer 10 (10a), and thus a semiconductor device (flexible semiconductor device) 100 of this embodiment is obtained. The metal layer 10a can be patterned by etching.

The semiconductor device 100 of this embodiment comprises an organic semiconductor section 30 formed inside the through hole 17 formed on the resin film 12b of the multilayer resin substrate 15, a source electrode 20s and a drain electrode 20d, that are sandwiched between the resin film 12b and the resin film 12a and constitute a part of the bottom surface 17b of the through hole 17, a gate insulating film 22 formed over the through hole 17, and a gate electrode 20g formed on the gate insulating film 22. Therefore, the semiconductor device 100 can realize a flexible semiconductor device having a simple structure utilizing the interlayer connection structure of the multilayer resin substrate 15. As a result, the semiconductor device 100 can be manufactured with high productivity.

The semiconductor device 200 can also be manufactured by a method similar to that described above. Namely, instead of the steps 1 and 2, the resin film 12 having the electrically conductive layer 10 in which one part serves as a gate electrode 20g formed on one surface thereof, and the electrically conductive layer 10 in which one part serves as a source electrode 20s and the electrically conductive layer 10 in which one part serves as a drain electrode 20d formed on the other surface is prepared. Then the through hole 17 is formed in the resin film 12 by the method shown in the step 3 b, the organic semiconductor section 30 shown in the step 4 is formed, the lower gate insulating film 22 shown in the step 5, the metal layer (electrically conductive layer) 10a including the gate electrode 20g is formed as shown in the step 6, and furthermore the wiring layer 10 including the gate electrode 20g and another wiring layer 10 (10a) are formed as shown in the step 7, and thus a semiconductor device 200 can be manufactured.

The advantages of the methods of manufacturing semiconductor devices 100, 200 will be described below.

In the conventional art, total printing process is employed where the electrically conductive layer (wiring) may also be formed together with the organic semiconductor section, in which case wirings are often formed from metal nano-paste. However, the metal nano-paste is very expensive. In addition, the wiring that is formed from the metal nano-paste tends to have higher electrical resistance than a typical wiring formed from copper does. The method of this embodiment makes it possible to easily form the typical copper wiring without using the expensive nano-paste, and therefore offers high technical value.

There is also such an advantage that, since the source electrode 20s, the drain electrode 20d and the organic semiconductor section 30 are formed in the through hole 17, these components can be easily positioned with high accuracy.

As a result, the semiconductor devices 100, 200 are free from the problems described below, which are encountered in the semiconductor device 1000 of the conventional art where the layers are formed by ink jet printing method.

When the layers are formed by ink jet printing, it is necessary to hold the liquid material precisely at the predetermined positions by means of bank or other members so as to form the layers at the desired positions, resulting in problems related to the formation of the bank or other members and the positioning accuracy. In addition, there is such a problem that the organic device becomes thicker as flatness of the organic semiconductor device is maintained, since the layers such as the source electrode layer, the drain electrode layer, the organic semiconductor layer, the insulating layer and the gate electrode layer are stacked one on another on the substrate by ink jet printing process. Moreover, there is a problem of decreasing yield of production due to the accuracy of positioning operations, when forming the layers one on another by printing. The yield of production tends to decrease as the semiconductor device 1000 becomes larger in size.

When the semiconductor device 1000 is used in an image display apparatus such as organic EL display, in particular, the problem related to the printing process described above may be tolerated if the screen is small as in such a case as a cellular phone, although the problem of printing process becomes conspicuous if the screen is large (a large screen of 1 meter class).

However, since the through hole 17 can be formed in the semiconductor devices 100 and 200 easily at the desired position by means of laser or the like, the problem described above does not arise as the semiconductor element such as TFT can be accurately positioned with ease.

With the constitution of the semiconductor device 100, outer periphery of the organic semiconductor section 30 can be covered with the insulating film (gate insulating film) 22, the wall surface (inner wall) 17a of the resin film 12b, the gate insulating film 22, the source electrode 20s, the drain electrode 20d and the upper surface of the resin film 12a, and thus chronic degradation (for example, oxidation) of the organic semiconductor that constitutes the organic semiconductor section 30 can be suppressed.

Also regarding the semiconductor device 200, by covering the portion exposed from the lower surface of the resin film 12 of organic semiconductor section 30 in FIG. 1 with a resin film or an insulating film, chronic degradation (oxidation) of the organic semiconductor can be suppressed, similar to the semiconductor device 100.

Second Embodiment

Semiconductor devices 102 and 103 of the second embodiment of the present invention will be described below with reference to FIG. 7 and FIG. 8.

Figure 7:
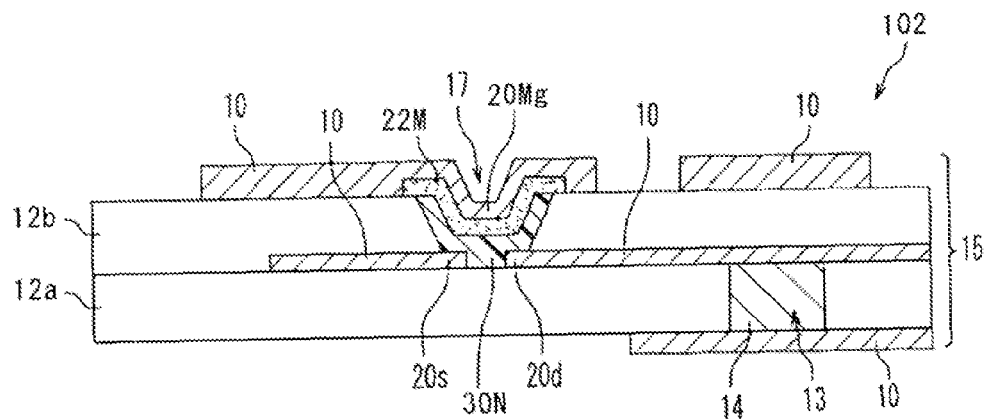
FIG. 7 is a sectional view showing a method for manufacturing a semiconductor device 102 according to a second embodiment of the present invention.

FIG. 7 is a sectional view showing a cross section of a semiconductor device 102. In the semiconductor device 102, the organic semiconductor section 30N is different from the organic semiconductor section 30 of the semiconductor device 100 of the first embodiment in that the organic semiconductor section has a recess section (hollow space). Along the recess section (along the wall surface of the hollow space) of the organic semiconductor section 30N, a gate insulating film 22M is formed. Namely, one end of the organic semiconductor section 30N is the wall surface of the hollow space, and the wall surface of the hollow space makes contact with the gate insulating film 22M, while the other end makes contact with the source electrode 20s and the drain electrode 20d. Furthermore, along the gate insulating film 22M, a gate electrode 20Mg is formed in the hollow space of the organic semiconductor 30N.

The organic semiconductor section 30N including the hollow space can obtained, for example, by forming a material including an organic semiconductor on the wall surface (inner wall) of the through hole 17, the source electrode 20s, the drain electrode 20d and the upper surface of the resin film 12a in the form of a film (layer) in the through hole 17.

As described above, when the organic semiconductor section 30N includes the hollow space, it is possible to bring the gate insulating film 22M and the gate electrode 20Mg close to the source electrode 20s and the drain electrode 20d without changing the thickness of the resin film 12b.

In the semiconductor device 102, it is possible to further decrease a distance between the gate insulating film, and the drain electrode and the source electrode when compared with the case of the semiconductor device 101 without changing the thickness of the resin film 12b.

In the organic semiconductor section 30N, carrier is evocated at almost the entire portion located between the source electrode 20s and the drain electrode 20d and located at the upper portion, and thus the portion with high electric resistance in the vicinity of the wall surface 17a of the through hole 17 can be remarkably decreased. As a result, an ON/OFF ratio of drain electric current with or without application of a voltage (gate voltage) to the gate electrode 20 Mg can be more increased, and thus it is possible to flow (take-off) a large electric current.

Therefore, the semiconductor device 102 is particularly suited for use as a driver transistor for organic EL.

Furthermore, in the semiconductor device 102, it is also possible to decrease the amount of the organic semiconductor used for the organic semiconductor section 30N by including the hollow space.

Figure 8:
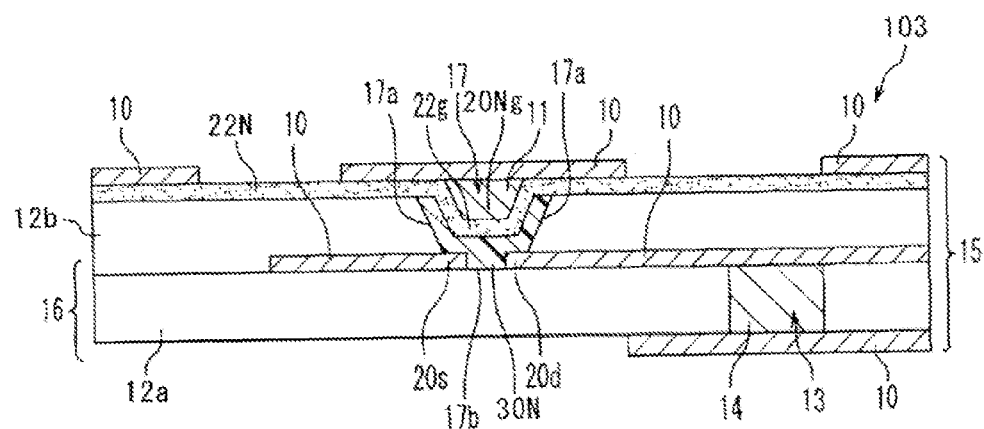
FIG. 8 is a sectional view showing a method for manufacturing a semiconductor device 103 according to the second embodiment of the present invention.
Figure 9:
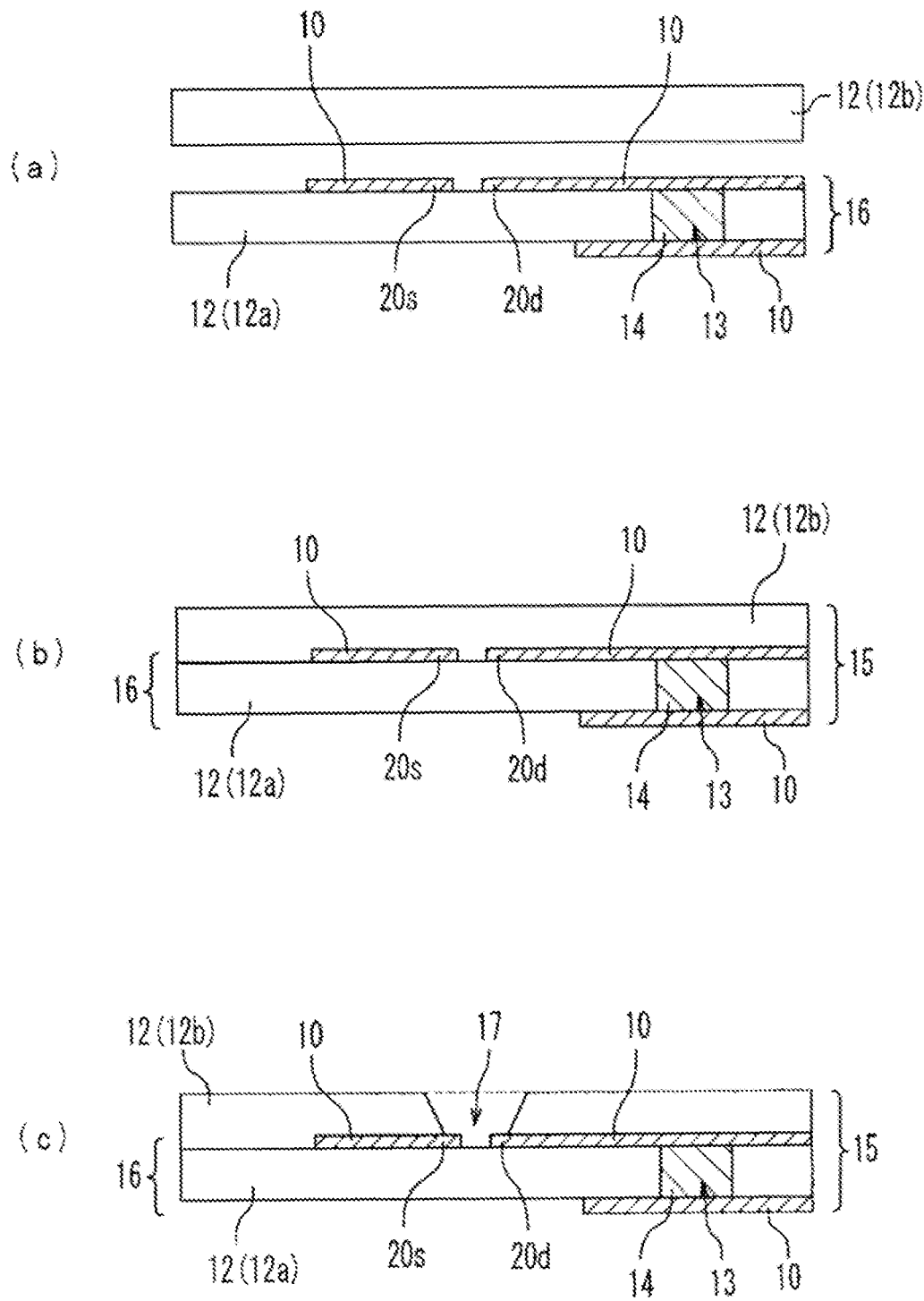
FIG. 9 is a sectional view showing a method for manufacturing a semiconductor device 103 according to the second embodiment of the present invention.
Figure 10:
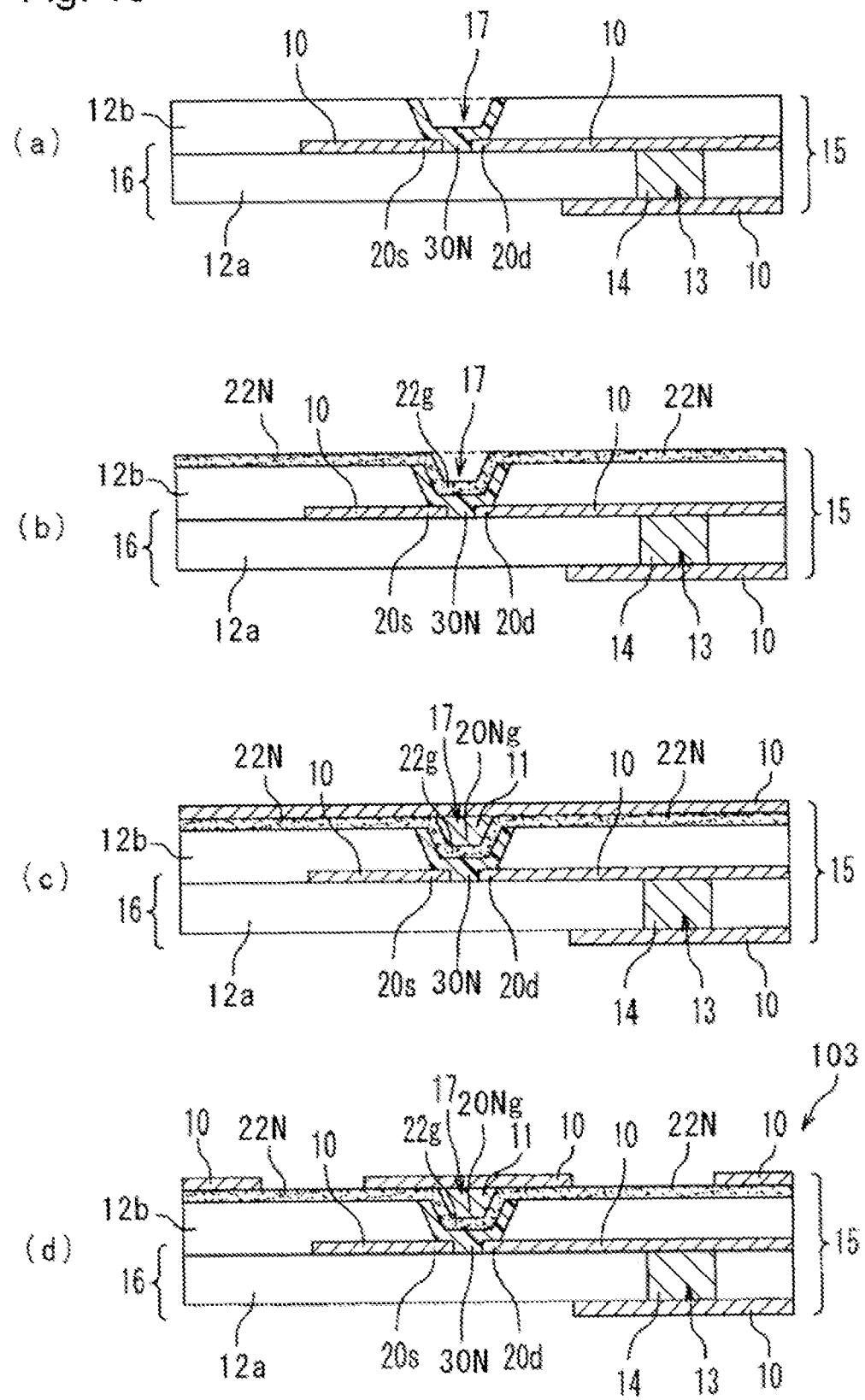
FIG. 10 is a sectional view showing a method for manufacturing a semiconductor device 103 according to the second embodiment of the present invention.

FIG. 8 is a sectional view showing a cross section of a semiconductor device 103.

The semiconductor device 103 is different from the semiconductor device 103 in that the insulating layer 22N is continuously formed to the upper surface of the resin film 12b and the wall surface of the hollow space of the organic semiconductor 30N, and that the portion serves as the gate insulating film 22g.

Furthermore, an electrically conductive filling material 11 fills the insulating film 22N (22g) in the through hole and an electrically conductive layer 10 is disposed thereon. The filling material 11 constitutes a gate electrode 20Ng. As the filling material 11, for example, metal plating (for example, copper plating) is used.

The height (or level) of the upper surface of the filling material 11 is made to be the same as that of the upper surface of the insulating layer 22N extending over the upper surface of the resin film 12b to obtain a flat surface, thus making it possible to form an electrically conductive layer 10 disposed thereon, which is flat and has a uniform thickness.

It is possible to use, as the material of the organic semiconductor section 30N of this embodiment, the same material having the same shape as that of the organic semiconductor section 30 of the first embodiment.

The method for manufacturing a semiconductor device 103 of this embodiment will be described below with reference to FIG. 9(a) to FIG. 10(d). Description resembling that of the method for manufacturing the semiconductor device 100 of the first embodiment will be omitted.

Step 1

As shown in FIG. 9(a), a resin film 12a having the electrically conductive layer 10 including the source electrode 20s and the electrically conductive layer 10 including the drain electrode 20d formed by patterning on one surface, and the electrically conductive layer 10 formed on the other surface, and a resin film 12b are prepared. The resin film 12a further includes a via conductor 14 which allows the electrically conductive layer 10 including the drain electrode 20d to conduct with electrically conductive layer 10 formed on the other surface.

In the embodiment of FIG. 9(a), the resin film 12a is, for example, a both-sided flexible substrate 16 having a copper wiring 10 formed on both surfaces, while the resin film 12b is a buildup insulating layer. The upper surface of the source electrode 20s and the drain electrode 20d may be subjected to Au plating.

Step 2

As shown in FIG. 9(b), the resin film 12b is bonded (stacked) on the upper surface (the surface provided with the source electrode 20s and the drain electrode 20d) of the both-sided flexible substrate 16 to form a multilayer resin substrate 15. This bending (laminating step) may be carried out under conditions of 80° C. and pressure of 0.5 MPa for 2 minutes. At the time of the laminating step, a protective film (for example, a PET film having a thickness of 18 μm) may be stacked on the upper surface of the resin film 12b.

Step 3

The through hole 17 is formed from the upper surface to the lower surface of the resin film 12b of the multilayer resin substrate 15 so that a part of the source electrode 20s and the drain electrode 20d is exposed as shown in FIG. 9(c). In this embodiment, the through hole 17 having diameter of 300 μm is formed by means of, for example, $CO_2$ laser.

Step 4

As shown in FIG. 10(a), a material including an organic semiconductor is applied inside the through hole 17 to form a layered organic semiconductor section 30N inside the through hole 17.

In this embodiment, after forming a protective film (PET film) on the upper surface of the resin film 12b in advance, an organic semiconductor dissolved in xylene is applied inside the entire through hole 17 from the upper surface of the resin film 12b by spin coating. Then the protective film of the upper surface of the resin film 12b, and thus the organic semiconductor is applied inside the through hole 17.

Subsequently, the solvent (xylene) is vaporized by a heat treatment (for example, at 200° C. for 30 minutes) and the organic semiconductor is crystallized to obtain an organic semiconductor section 30N.

In the step 4, a protective film (PET film) is used and, after filling (applying) the organic semiconductor, the protective film is peeled off, and thus the organic semiconductor was filled only inside the through hole 17. Therefore, the organic semiconductor is not applied to the other unnecessary portion and a printing plate is not required. It also becomes possible to prevent adhesion of impurities onto the portion other then the filling section (through hole 17).

Step 5

As shown in FIG. 10(b), on an organic semiconductor section 30N, an insulating layer 22N containing a gate insulating film 22g is formed. For example, an epoxy resin is spin-coated on the upper surface of the resin film 12 and the entire wall surface of the hollow space of the organic semiconductor section 30N, dried at 80° C. and then heat-treated at 200° C. thereby completing thermocuring to form an insulating film 22N.

As shown in FIG. 10(c), the entire surface of the gate insulating film 22g is subjected to a copper plating treatment to form a filling material 11 for filling the through hole 17 (the hollow space of the semiconductor section 30N), and thus a gate electrode 20Ng is obtained, and an electrically conductive layer 10 is formed thereon.

The filling material 11 can be formed by using an electrically conductive paste prepared by adding a large amount of an electrically conductive metal filler to a liquid resin. For example, a paste obtained by mixing a liquid epoxy resin with about 90% by weight of an Ag powder having a diameter of 1 μm is filled inside the copper-plated through hole 17 and the epoxy resin is cured, and thus making it possible to form a flattened (the filling material 11 is filled inside the through hole 17 and the position of the upper surface is made to be the same as that of the upper surface of the insulating layer 22N extending over the upper surface of the resin film 12a) filling material 11.

The filling material 11 may also be formed by performing copper plating to be formed inside the through hole 17 until flattening is completed in the case of a copper plating treatment of the entire surface.

The method of filling inside the through hole 17 by copper plating includes, for example, a via-filling plating method (or filled plating method). The via-filling plating method is a method utilizing a copper sulfate plating bath containing an inhibitor for inhibiting plating growth and an accelerator for accelerating plating growth added therein. The inhibitor has such characteristics that it is not easily adsorbed inside the via hole 17 in accordance with diffusion rule of the substance, and is easily adsorbed on the substrate surface (the surface of the insulating layer 22N, that extends over the upper surface of the resin film 12b, hereinafter referred to as an "upper surface of the insulating layer 22N"). According to the characteristics, copper can be preferentially precipitated inside the via hole 17 by increasing the concentration of the inhibitor of the upper surface of the insulating layer 22N to the concentration higher than that of the inhibitor inside the through hole 17.

The accelerator is uniformly adsorbed on the bottom surface and the side surface of the via hole 17, and the upper surface of the insulating layer 22N at the initial stage of plating. When the surface area of the via hole 17 decreases with the plating growth inside the via hole 17, the concentration of the accelerator inside the via hole 17 increases. As a result, the plating rate inside the via hole 17 becomes higher than that of the upper surface of the insulating layer 22N.

Usually, the inhibitor and the accelerator are blended (mixed) in the same plating bath in a proper ratio according to plating conditions. When the plating growth rate inside the via hole 17 is increased to the plating growth rate higher than that of the upper surface of the insulating layer 22N by the effects of both the inhibitor and the accelerator, it is possible to fill the through hole 17 by copper plating to form a filling material 11.

As shown in FIG. 10(d), the metal layer (copper layer) formed by copper plating is patterned by etching to form a wiring layer (electrically conductive layer) 10 connected to the gate electrode 20Ng and the other wiring layer 10, and thus a semiconductor device 103 is obtained.

When the semiconductor device 103 has a plurality of through holes 17, it is possible to simultaneously form an inner via conductor that electrically connect wiring 10 of the upper surface of the rein film 12b to wiring 10 of the lower surface of the rein film 12b by a copper plating treatment of the step 6 by forming no organic semiconductor and insulating layer 22g with respect to a part of through hole 17 using a mask in the stage of the step 3.

Third Embodiment

Figure 11:
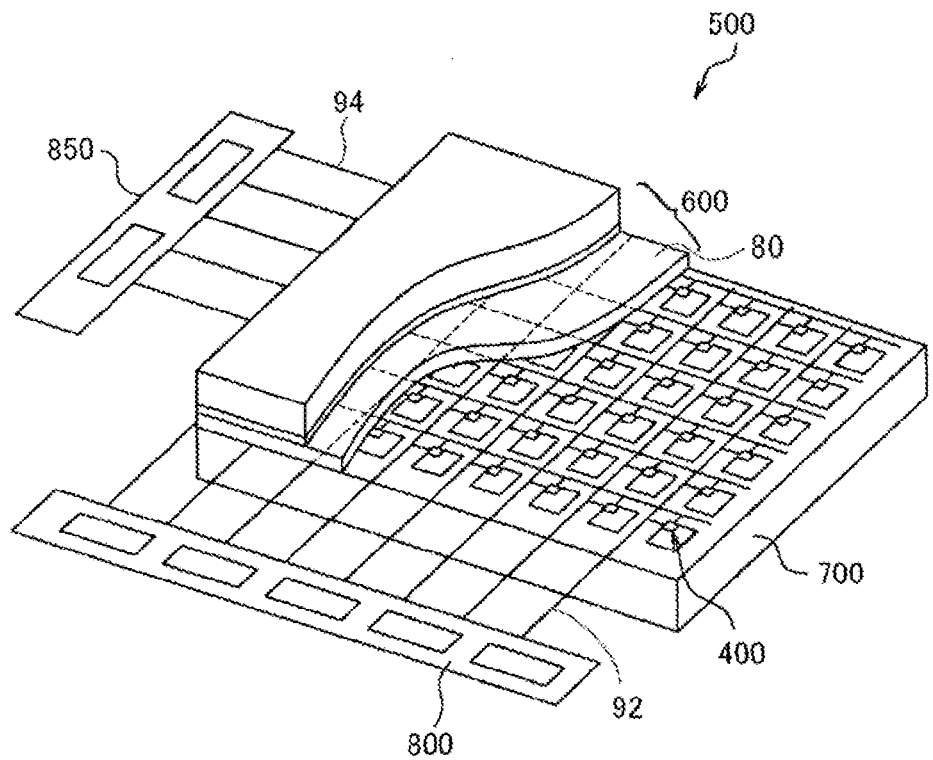
FIG. 11 is a perspective view schematically showing an image display apparatus 500 according to the third embodiment of the present invention.

FIG. 11 is a cutaway perspective view showing an image display apparatus (organic EL display apparatus) 500 according to the present invention. The image display apparatus 500 comprises a light emitting layer 600 consisting of a plurality of light emitting elements 80 disposed in an orderly arrangement, a drive circuit layer 700 consisting of a plurality of semiconductor devices 300 for driving (switching ON/OFF) the light emitting elements and driver sections 800, 850 that supply electric current via a data line 92 and a switching line 94 to the drive circuit layer 700.

Figure 12:
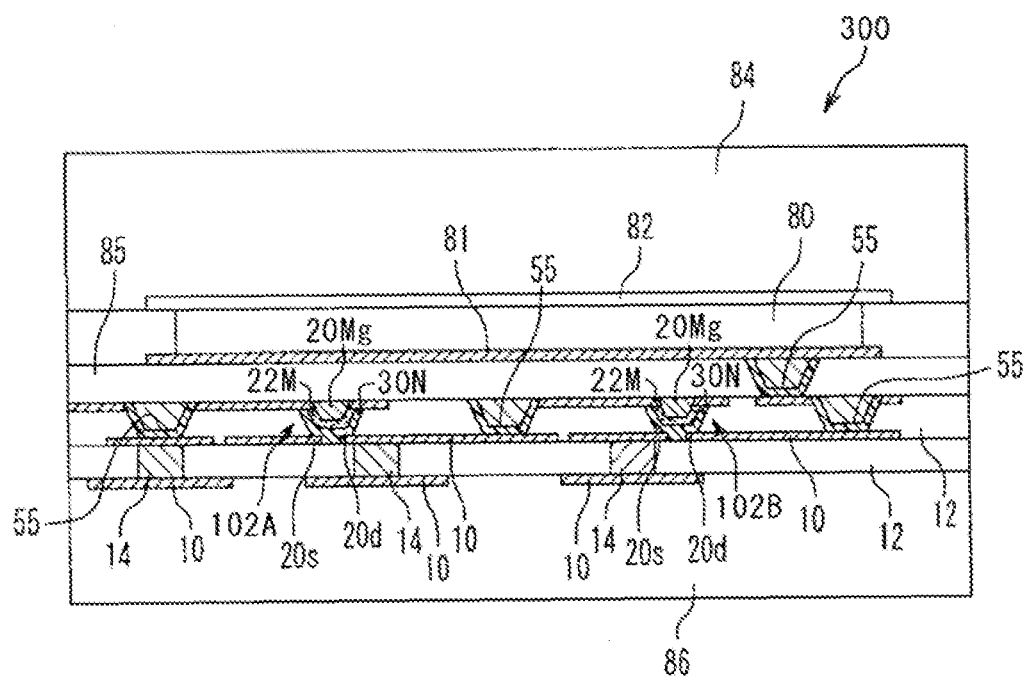
FIG. 12 is a sectional view schematically showing the constitution of a semiconductor device 300 according to the third embodiment of the present invention.

FIG. 12 is a sectional view showing the semiconductor device 300.

The semiconductor device 300 constitutes a part of the image display apparatus 500. The semiconductor device 300 is a light emitting element control device that has one organic EL element (light emitting element) 80 for each pixel of the image display apparatus 500, and controls the emission of light from the light emitting element 80, and therefore the same number of semiconductor devices 300 as the pixels of the image display apparatus 500 are included in the image display apparatus 500. The semiconductor device 300 will be described below with reference to FIG. 12.

Figure 13:
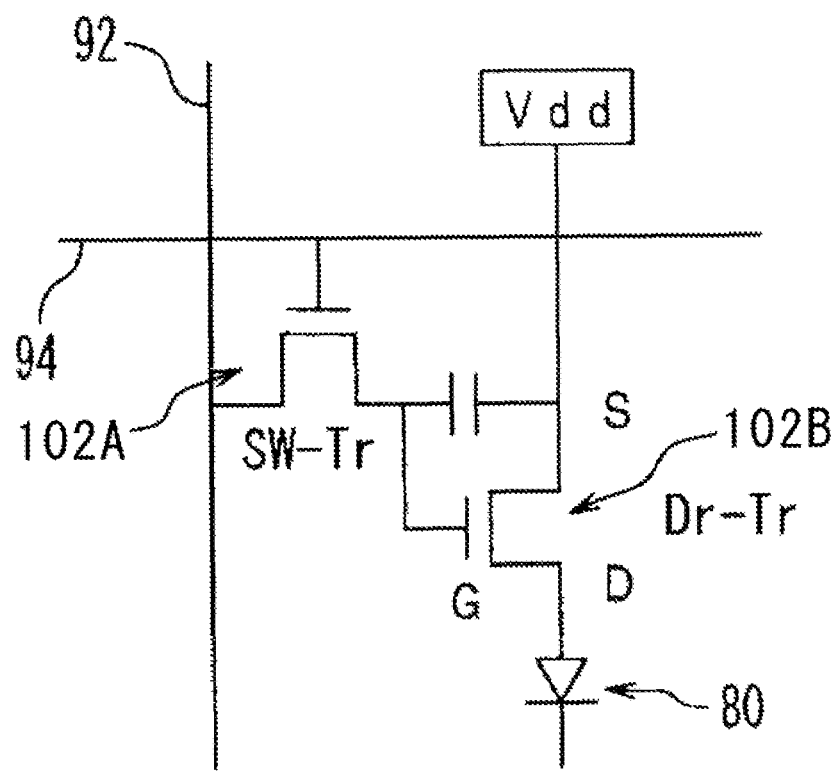
FIG. 13 is a diagram showing an equivalent circuit of the semiconductor device 300.
Figure 14:
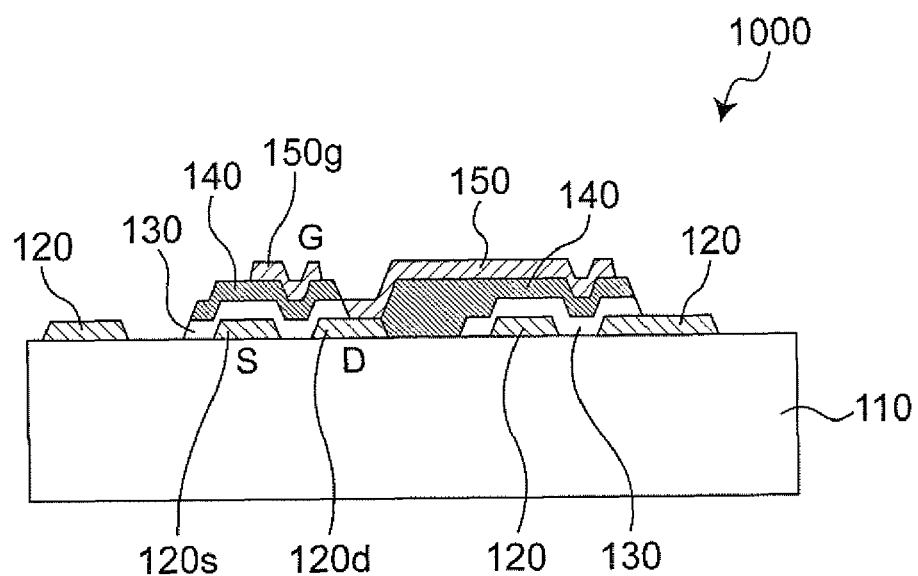
FIG. 14 is a sectional view schematically showing the constitution of a semiconductor device 1000 of the conventional art.

The semiconductor device 300 has two semiconductor elements (semiconductor elements 102A, 102B) included in the semiconductor device (organic semiconductor device) 102 of the first embodiment, as represented by the equivalent circuit of FIG. 13.

Of the two semiconductor elements 102A and 102B, one is used as a switching transistor 102A and the other is used as a driver transistor 102B. The semiconductor elements 102A and 102B are disposed on a reinforcement film 86 (for example, a resin film such as PET, PEN).

The semiconductor elements 102A, 102B of this embodiment are formed under the organic EL element 80, and the semiconductor element 102B is connected with the organic EL element 80. Formed above the organic EL element 80 is a transparent electrode 82 that is electrically connected to the organic EL element 80, and is provided with a protective film (for example, a resin film such as PET, PEN) 84 formed thereon.

In the resin film 12, an inner via (or an inner conductor) 55 constituted from an interlayer connection member may be formed. The inner via 55 is that in which the organic semiconductor section 30, the insulating layer 22N and the gate electrode 20Mg are not formed inside the through hole 17, and the through hole 17 is filled by a metal layer. The inner via 55 can be formed by proper masking utilizing the same step as that of forming the semiconductor elements 102A and 102B.

The wiring 92 shown in FIG. 13 is the data line, and is electrically connected to the electrically conductive layer 10 that is connected to the source electrode 20s of the semiconductor element 102A of FIG. 12, although not shown in FIG. 12. The wiring 94 is a selection line (switching line), and is electrically connected to the gate electrode 20Mg of the semiconductor element 102A.

The light emitting element 80 is driven to emit light by controlling the electric currents flowing in the data line 92 and in the switching line 94 by means of the driver sections 800, 850, thereby controlling the electric currents flowing from the driver transistor 102B to the organic EL element 80 and the transparent electrode 82 by means of the semiconductor element 102A. In other words, the semiconductor element 102A is used as a switching transistor that turns on or off the organic EL element (light emitting element) 80.

Depending on the constitution of the image display apparatus 500, three or more semiconductor elements such as transistor, instead of two (one semiconductor element 102A and one semiconductor element 102B), may be provided and the semiconductor elements of the semiconductor device 102 of this embodiment may also be provided as the third or further transistor.

Besides the semiconductor device 102, any of the semiconductor devices (semiconductor devices 100, 101, 102, 103, 200) of the present invention described in this specification may be used as the semiconductor element (the switching transistor 102A and the driver transistor 102B) of the semiconductor device 300.

All of the semiconductor devices and the semiconductor elements of the present invention are not limited to the application to the organic EL display, and these devices and elements may be used in other image display apparatuses (such as liquid crystal display apparatus), and also in electronic paper. Moreover, all of the semiconductor devices and the semiconductor elements of the present invention can be used in various applications (such as RF-ID, memory, MPU, solar cell and sensor) that are being studied as the fields of the application of the printing electronics.

The image display apparatus 500 may be used as other types of image display apparatus such as liquid crystal display or plasma display apparatus, besides the organic EL display apparatus, by replacing the organic EL elements described above with other type of light emitting element such as liquid crystal element or plasma light emitting element.

While the present invention has been described by way of preferred embodiments, the description is not restrictive and leaves the possibilities of various modifications. For example, the semiconductor device 100 is manufactured in correspondence to one device in the embodiment described above, although the invention is not limited to this and a method of manufacturing the semiconductor device in correspondence to a plurality of devices may also be employed. A roll-to-roll process may be employed as such a manufacturing method. The effects of the constitution of this embodiment can be exploited more conspicuously when an organic semiconductor material having higher mobility to be developed in the future is used, thus providing greater technological advantage.

The present application claims priority based on Japanese Patent Application No. 2007-205203. The disclosure of Japanese Patent Application No. 2007-205203 is incorporated by reference herein.

The present invention makes it possible to provide a semiconductor device that has a simple structure which utilizes the interlayer connection structure and high density of integration.

The invention claimed is:

1. A semiconductor device comprising:
a first resin film having a through hole penetrating from a first major surface to a second major surface thereof;
an organic semiconductor disposed inside the through hole, the organic semiconductor being formed along a wall surface of the through hole and having a hollow space;
an insulating film on the upper surface of the organic semiconductor located at the first major surface side;
a gate electrode on the insulating film, the gate electrode being inflexed to lie along a wall surface of the hollow space of the organic semiconductor, the inflexed gate electrode having a hollow space on a side opposite to the insulating film;
a source electrode connected electrically to the lower surface of the organic semiconductor located at the second major surface side; and
a drain electrode connected electrically to the lower surface of the organic semiconductor.

2. The semiconductor device according to claim 1, further comprising a second resin film bonded to the second major surface of the first resin film.

3. The semiconductor device according to claim 2, wherein the second resin film has a second through hole and a via conductor formed from an electrically conductive composite material in the second through hole.

4. The semiconductor device according to claim 2, wherein the organic semiconductor is sealed by the source electrode, the drain electrode, the insulating film and the second resin film.

5. The semiconductor device according to claim 1, wherein the source electrode and the drain electrode have comb shape and are disposed to oppose each other at a distance so as to mesh with each other.

6. The semiconductor device according to claim 1, wherein the insulating layer is located in the through hole.

7. The semiconductor device according to claim 1, wherein the inflexed gate electrode has a convex surface on the first major surface side.

8. The semiconductor device according to claim 1, wherein the hollow space of the organic semiconductor is filled with the gate electrode.

9. The semiconductor device according to claim 8, wherein the insulating film extends over the first major surface of the first resin film.

10. The semiconductor device according to claim 1, wherein the organic semiconductor is a high molecular organic semiconductor.

11. The semiconductor device according to claim 1, wherein the organic semiconductor is a low molecular organic semiconductor.

12. The semiconductor device according to claim 1, wherein the first resin film is formed from any one material selected from the group consisting of a polyimide resin, a polyamide resin, a polyethylene naphthalate resin and an aramid resin.

13. The semiconductor device according to claim 1, wherein the source electrode and the drain electrode are formed from a noble metal.

14. An image display apparatus comprising a display section having an array of light emitting elements and a drive circuit layer for driving the light emitting elements used in the display section, wherein the drive circuit layer includes the semiconductor device according to claim 1.

15. The image display apparatus according to claim 14, wherein the semiconductor element of the semiconductor device is an ON/OFF switching transistor.

16. The image display apparatus according to claim 14, wherein the semiconductor element of the semiconductor device is a driver transistor for driving the light emitting element to emit light.

17. The image display apparatus according to 14, wherein the light emitting element is an organic electroluminescence element.

18. A method for manufacturing a semiconductor device, the method comprising:
  (1) forming a source electrode and a drain electrode on one surface of a first resin film and forming a through hole in the first resin film, the source electrode and the drain electrode being located on the bottom of the through hole;
  (2) forming an organic semiconductor in the through hole such that one end of the organic semiconductor contacts the source electrode and the drain electrode, the organic semiconductor being formed along the wall surface of the through hole and having a hollow space;
  (3) forming an insulating layer on the other end of the organic semiconductor, a part of the insulating layer for serving as a gate insulating film; and
  (4) forming a gate electrode on the section for serving as the gate insulating film of the insulating layer, the gate electrode being inflexed to lie along a wall surface of the hollow space of the organic semiconductor, the inflexed gate electrode having a hollow space on a side opposite to the insulating film.

19. The method of claim 18, wherein said step (1) includes disposing the one surface of the first resin film on the surface of a second resin film having the source electrode and the drain electrode disposed thereon.

20. The method of claim 19, wherein the surface of the second resin film having the source electrode and the drain electrode is a first surface, and the second resin film further includes a second surface, and
  wherein the second resin film comprises a wiring layer disposed on the second surface, and a via conductor for allowing the wiring layer to conduct with the source electrode or the drain electrode.

21. The method of claim 18, wherein the inflexed gate electrode has a convex surface on the first major surface side.

22. The method of claim 18, wherein the insulating layer and the gate electrode are formed successively so as to fill the hollow space.

23. The method of claim 22, wherein the insulating layer extends over the other surface of the first resin film.

* * * * *